(12) United States Patent
Hao et al.

(10) Patent No.: US 12,166,533 B2
(45) Date of Patent: Dec. 10, 2024

(54) TEST METHOD, APPARATUS, AND SYSTEM

(71) Applicant: HUAWEI TECHNOLOGIES CO., LTD., Guangdong (CN)

(72) Inventors: Bo Hao, Xi'an (CN); Yecun Huang, Shenzhen (CN); Liang Hu, Dongguan (CN); Jutian Guo, Dongguan (CN); Wei Zhai, Shenzhen (CN); Chengwen Yan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/702,181

(22) Filed: Mar. 23, 2022

(65) Prior Publication Data

US 2022/0216926 A1    Jul. 7, 2022

Related U.S. Application Data

(63) Continuation of application No. PCT/CN2020/117049, filed on Sep. 23, 2020.

(30) Foreign Application Priority Data

Sep. 23, 2019    (CN) .......................... 201910901411.0

(51) Int. Cl.
| | |
|---|---|
| H04B 17/00 | (2015.01) |
| H03M 1/00 | (2006.01) |
| H04B 17/10 | (2015.01) |
| H04B 17/20 | (2015.01) |

(52) U.S. Cl.
CPC ........ *H04B 17/0085* (2013.01); *H03M 1/001* (2013.01); *H04B 17/10* (2015.01); *H04B 17/20* (2015.01)

(58) Field of Classification Search
CPC .......................... H04B 17/0085; H04B 17/29; H04B 17/0087; H04B 17/364; H04B 2001/0408; H04B 17/3912; H04B 17/17; H04B 1/1027; H04B 17/13; H04B 1/10; H04B 1/525; H04B 10/07953; H04B 17/15; H04B 17/336
USPC ..................................................... 455/115.2
See application file for complete search history.

(56) References Cited

U.S. PATENT DOCUMENTS

| | | | |
|---|---|---|---|
| 2011/0257923 A1* | 10/2011 | Boulton | H04L 41/22 702/117 |
| 2016/0286483 A1* | 9/2016 | Bergström | H04W 48/18 |
| 2017/0272353 A1* | 9/2017 | Cao | H04L 63/1433 |
| 2021/0314075 A1* | 10/2021 | Qi | H04B 17/0087 |
| 2022/0078643 A1* | 3/2022 | Vierimaa | H04B 17/15 |

* cited by examiner

*Primary Examiner* — Ajibola A Akinyemi
(74) *Attorney, Agent, or Firm* — Fish & Richardson P.C.

(57) ABSTRACT

Example test methods and apparatus are described. One example method includes receiving an uplink radio frequency signal by a test device from a terminal device, where the uplink radio frequency signal is generated by superimposing at least two test signals, and each of the at least two test signal corresponds to one communication protocol. The test device extracts the at least two test signals from the uplink radio frequency signal. The test device separately tests the at least two test signals, and obtains an uplink test result of the terminal device.

14 Claims, 10 Drawing Sheets

TEST METHOD, APPARATUS, AND SYSTEM

CROSS-REFERENCE TO RELATED APPLICATIONS

This application is a continuation of International Application No. PCT/CN2020/117049, filed on Sep. 23, 2020, which claims priority to Chinese Patent Application No. 201910901411.0, filed on Sep. 23, 2019. The disclosures of the aforementioned applications are hereby incorporated by reference in their entireties.

TECHNICAL FIELD

Embodiments of this application relate to the communication field, and in particular, to a test method, apparatus, and system.

BACKGROUND

Terminal devices on the current market relate to a plurality of communication protocols, for example, long term evolution (LTE), wideband code division multiple access (wideband code division multiple access, WCDMA), global system for mobile communications (GSM), time division-synchronous code division multiple access (TD-SCDMA), wireless local area network (WLAN), Bluetooth, and other protocols. With the addition of next-generation communication protocols such as 5G, a terminal device needs to support a growing quantity of communication protocols. This poses a high challenge to efficiency of testing a communication function of the terminal device under different communication protocols.

In the conventional technology, testing of the communication function includes a sweep-frequency tuning test method and a single-protocol fast Fourier transform test method. In the sweep-frequency tuning test method, the terminal device may change a local oscillator frequency of a down conversion mixer, so that a difference between a frequency of an input signal to be tested and the local oscillator frequency is equal to a required fixed intermediate frequency. Subsequently, a band-pass filter is used to extract the required frequency difference from an intermediate frequency signal, to test and analyze the signal to be tested. In the single-protocol fast Fourier transform test method, a test device digitizes, in time domain, the signal to be tested and then performs fast Fourier transform to obtain a spectrum. Then, a low-pass filter in the test device removes high-frequency components beyond a measurement range from the signal to be tested, and then samples a waveform for analog-to-digital conversion. Subsequently, a microprocessor in the test device receives a sampled waveform and calculates a spectrum of the waveform by using fast Fourier transform.

However, the sweep-frequency tuning test method is complex in hardware system, and is applicable only to single-protocol non-real-time measurement, and has a relatively low speed for a large-scale test of a multi-protocol terminal device. The single-protocol fast Fourier transform test method is deeply coupled to characteristics of a front-end radio frequency device. For the large-scale test of the multi-protocol terminal device, each protocol can only be tested serially, and the radio frequency front-end needs to be reconfigured in the process. A test time is multiplied with an increase of a quantity of protocols to be tested. Therefore, the foregoing two existing methods for testing a communication function have relatively low speeds for testing a communication function of the multi-protocol terminal device.

SUMMARY

Embodiments of this application provide a test method, apparatus, and system, to resolve a problem in the conventional technology that a speed of testing a multi-protocol terminal device is relatively low.

A first aspect provides a test method. The method may be applied to a test device, or may be applied to a chip of the test device. The following provides description by using an example in which the test method is applied to the test device. In this method, the test device receives an uplink radio frequency signal sent by a terminal device, where the uplink radio frequency signal is generated by superimposing at least two test signals, and each of the test signals corresponds to one communication protocol and is used to test an uplink communication function of the terminal device corresponding to the communication protocol. After extracting the at least two test signals from the uplink radio frequency signal, the test device separately tests the at least two test signals, and obtains an uplink test result of the terminal device.

In the test method provided in the first aspect, when the terminal device includes a plurality of communication protocols, parallel testing of the plurality of communication protocols can be implemented, so that efficiency of testing a communication function of the terminal device is significantly improved.

In a possible implementation, that the test device extracts the at least two test signals from the uplink radio frequency signal includes: The test device performs analog-to-digital conversion on the uplink radio frequency signal, to generate an in-phase/quadrature signal; and the test device digitally down-converts the in-phase/quadrature signal to a radio frequency of the communication protocol, and extracts the at least two test signals.

In the test method provided in this possible implementation, test signals can be quickly and accurately extracted through analog-to-digital conversion and down conversion of the uplink radio frequency signal, to further implement parallel testing of a plurality of communication protocols, so that efficiency of testing a communication function of the terminal device is significantly improved.

In a possible implementation, before the test device digitally down-converts the in-phase/quadrature signal to the radio frequency of the communication protocol, the method further includes: The test device filters the in-phase/quadrature signal.

In the test method provided in this possible implementation, spurious waves in the uplink radio frequency signal can be removed, so that the test signal can be more accurately extracted.

In a possible implementation, before the test device separately tests the at least two test signals, the method further includes: The test device preprocesses the at least two test signals, where the preprocessing includes: signal synchronization processing and/or signal balancing processing.

In the test method provided in this possible implementation, an impact of signal interference on the test result can be alleviated, to improve accuracy of the test result.

In a possible implementation, the uplink test result includes at least one of the following: an error vector magnitude EVM, an adjacent channel power ratio ACPR, and a power.

A second aspect provides a test method. The method may be applied to a terminal device, or may be applied to a chip of the terminal device. The following provides description by using an example in which the test method is applied to the terminal device. In this method, the terminal device generates an uplink radio frequency signal according to a test protocol, and sends the uplink radio frequency signal to a test device.

A third aspect provides a test method. The method may be applied to a test device, or may be applied to a chip of the test device. The following provides description by using an example in which the test method is applied to the test device. In this method, the test device generates at least two test signals according to communication protocols, where each of the test signals corresponds to one of the communication protocols and is used to test a downlink communication function of the terminal device corresponding to the communication protocol. Subsequently, the test device generates a downlink radio frequency signal by superimposing the at least two test signals; and sends the downlink radio frequency signal to the terminal device, where the downlink radio frequency signal is used to determine a downlink test result of the terminal device.

In a possible implementation, that the test device generates the downlink radio frequency signal based on the at least two test signals includes: The test device up-converts the at least two test signals that occupy different frequency bands in frequency domain to radio frequency frequencies of the communication protocols, and performs superimposition in time domain to synthesize an in-phase/quadrature signal; and the test device performs digital-to-analog conversion on the in-phase/quadrature signal, to generate the downlink radio frequency signal.

In a possible implementation, before the test device up-converts the at least two test signals to the radio frequency of the communication protocols, and performs superimposition to synthesize the in-phase/quadrature signal, the method further includes: The test device filters the at least two test signals.

In a possible implementation, the downlink test result includes at least one of the following: signal sensitivity, blocking, and adjacent channel selectivity.

A fourth aspect provides a test method. The method may be applied to a terminal device, or may be applied to a chip of the terminal device. The following provides description by using an example in which the test method is applied to the terminal device. In this method, the terminal device receives a downlink radio frequency signal sent by a test device, and determines a downlink test result of the terminal device based on the downlink radio frequency signal.

A fifth aspect provides a test apparatus, including a first transceiver module and a first processing module.

The first transceiver module is configured to receive an uplink radio frequency signal sent by a terminal device, where the uplink radio frequency signal is generated by superimposing at least two test signals, and each of the test signals corresponds to one communication protocol and is used to test an uplink communication function of the terminal device corresponding to the communication protocol.

The first processing module is configured to: extract the at least two test signals from the uplink radio frequency signal; and separately test the at least two test signals, and obtain an uplink test result of the terminal device.

In a possible implementation, the first processing module is specifically configured to: perform analog-to-digital conversion on the uplink radio frequency signal, to generate an in-phase/quadrature signal; and digitally down-convert the in-phase/quadrature signal to a radio frequency of the communication protocol, and extract the at least two test signals.

In a possible implementation, the first processing module is further configured to filter the in-phase/quadrature signal.

In a possible implementation, the first processing module is further configured to preprocess the at least two test signals, where the preprocessing includes: signal synchronization processing and/or signal balancing processing.

In a possible implementation, the uplink test result includes at least one of the following: an error vector magnitude EVM, an adjacent channel power ratio ACPR, and a power.

A sixth aspect provides a test apparatus, including a third transceiver module and a third processing module.

The third processing module is configured to generate an uplink radio frequency signal.

The third transceiver module is configured to send the uplink radio frequency signal to the test device.

A seventh aspect provides a test apparatus, including a second processing module and a second transceiver module.

The second processing module is configured to: generate at least two test signals according to communication protocols, where each of the test signals corresponds to one of the communication protocols and is used to test a downlink communication function of the terminal device corresponding to the communication protocol; and generate a downlink radio frequency signal by superimposing the at least two test signals.

The second transceiver module is configured to send the downlink radio frequency signal to the terminal device, where the downlink radio frequency signal is used to determine a downlink test result of the terminal device.

In a possible implementation, the second processing module is specifically configured to: up-convert, by the test device, the at least two test signals that occupy different frequency bands in frequency domain to radio frequency frequencies of the communication protocols, and perform superimposition in time domain to synthesize an in-phase/quadrature signal; and perform digital-to-analog conversion on the in-phase/quadrature signal, to generate the downlink radio frequency signal.

In a possible implementation, the second processing module is further configured to filter the at least two test signals.

In a possible implementation, the downlink test result includes at least one of the following: signal sensitivity, blocking, and adjacent channel selectivity.

An eighth aspect provides a test apparatus, including a fourth processing module and a fourth transceiver module.

The fourth transceiver module is configured to receive a downlink radio frequency signal sent by the test apparatus.

The fourth processing module is configured to determine a downlink test result of a terminal device based on the downlink radio frequency signal.

A ninth aspect provides an electronic device, including a memory and a processor.

The memory is configured to store executable instructions of the processor.

The processor is configured to: receive an uplink radio frequency signal sent by a terminal device, where the uplink radio frequency signal is generated by superimposing at least two test signals, and each of the test signals corresponds to one communication protocol and is used to test an uplink communication function of the terminal device corresponding to the communication protocol; extract the at least two test signals from the uplink radio frequency signal; and separately test the at least two test signals, and obtain an uplink test result of the terminal device.

In a possible implementation, the processor is specifically configured to: perform analog-to-digital conversion on the uplink radio frequency signal, to generate an in-phase/quadrature signal; and digitally down-convert the in-phase/quadrature signal to a radio frequency of the communication protocol, and extract the at least two test signals.

In a possible implementation, the processor is further configured to filter the in-phase/quadrature signal.

In a possible implementation, the processor is further configured to preprocess the at least two test signals, where the preprocessing includes: signal synchronization processing and/or signal balancing processing.

In a possible implementation, the uplink test result includes at least one of the following: an error vector magnitude EVM, an adjacent channel power ratio ACPR, and a power.

A tenth aspect provides an electronic device, including a memory and a processor.

The memory is configured to store executable instructions of the processor.

The processor is configured to generate an uplink radio frequency signal according to a test protocol, and send the uplink radio frequency signal to a test device.

An eleventh aspect provides an electronic device, including a memory and a processor.

The memory is configured to store executable instructions of the processor.

The processor is configured to: generate at least two test signals according to communication protocols, where each of the test signals corresponds to one of the communication protocols and is used to test a downlink communication function of the terminal device corresponding to the communication protocol; generate a downlink radio frequency signal based on the at least two test signals; and send the downlink radio frequency signal to the terminal device, where the downlink radio frequency signal is used to determine a downlink test result of the terminal device.

In a possible implementation, the processor is specifically configured to: up-convert the at least two test signals to radio frequency frequencies of the communication protocols, and perform superimposition to synthesize an in-phase/quadrature signal; and perform digital-to-analog conversion on the in-phase/quadrature signal, to generate the downlink radio frequency signal.

In a possible implementation, the processor is further configured to filter, by the test device, the at least two test signals.

In a possible implementation, the downlink test result includes at least one of the following: signal sensitivity, blocking, and adjacent channel selectivity.

A twelfth aspect provides an electronic device, including a memory and a processor.

The memory is configured to store executable instructions of the processor.

The processor is configured to receive a downlink radio frequency signal sent by a test device, and determine a downlink test result of the terminal device based on the downlink radio frequency signal.

A thirteenth aspect provides a test system, including: a test device, a terminal device, a switch, and a server, where
the test device is connected to the terminal device, and the switch is separately connected to the test device, the terminal device, and the server;
the terminal device is configured to send an uplink radio frequency signal to the test device or receive a downlink radio frequency signal of the test device;
the test device is configured to perform the test method in the first aspect or the second aspect; and
the server is configured to send a test indication to the test device and the terminal device by using the switch, and obtain an uplink test result and/or a downlink test result of the terminal device.

According to a fourteenth aspect, a program is provided. The program is used to perform the method of the first aspect when being executed by a processor.

According to a fifteenth aspect, a program is provided. The program is used to perform the method according to the second aspect when being executed by a processor.

According to a sixteenth aspect, a program is provided. The program is used to perform the method according to the third aspect when being executed by a processor.

According to a seventeenth aspect, a program is provided. The program is used to perform the method according to the fourth aspect when being executed by a processor.

According to an eighteenth aspect, a program product such as a computer-readable storage medium is provided, where the program product includes the program in the fourteenth aspect.

According to a nineteenth aspect, a program product such as a computer-readable storage medium is provided, where the program product includes the program in the fifteenth aspect.

According to a twentieth aspect, a program product such as a computer-readable storage medium is provided, including the program in the sixteenth aspect.

According to a twenty-first aspect, a program product such as a computer-readable storage medium is provided, and includes the program in the seventeenth aspect.

According to a twenty-second aspect, a computer-readable storage medium is provided. The computer-readable storage medium stores instructions, and when the instructions are run on a computer, the computer is enabled to perform the method according to the first aspect.

A twenty-third aspect of this application provides a computer-readable storage medium. The computer-readable storage medium stores instructions, and when the instructions are run on a computer, the computer is enabled to perform the method according to the second aspect.

According to a twenty-fourth aspect, a computer-readable storage medium is provided. The computer-readable storage medium stores instructions, and when the instructions are run on a computer, the computer is enabled to perform the method according to the third aspect.

According to a twenty-fifth aspect, a computer-readable storage medium is provided. The computer-readable storage medium stores instructions, and when the instructions are run on a computer, the computer is enabled to perform the method according to the fourth aspect.

In the embodiments of this application, the test device receives the uplink radio frequency signal sent by the terminal device, where the uplink radio frequency signal is generated by at least two test signals, and each of the test signals corresponds to one communication protocol and is used to test the uplink communication function of the terminal device corresponding to the communication protocol. After extracting the at least two test signals from the uplink radio frequency signal, the test device separately tests the at least two test signals, and obtains the uplink test result of the terminal device. In this method, when the terminal device includes a plurality of communication protocols, parallel testing of the plurality of communication protocols can be implemented, so that efficiency of testing a communication function of the terminal device under different communication protocols is significantly improved.

DESCRIPTION OF EMBODIMENTS

Figure 1:
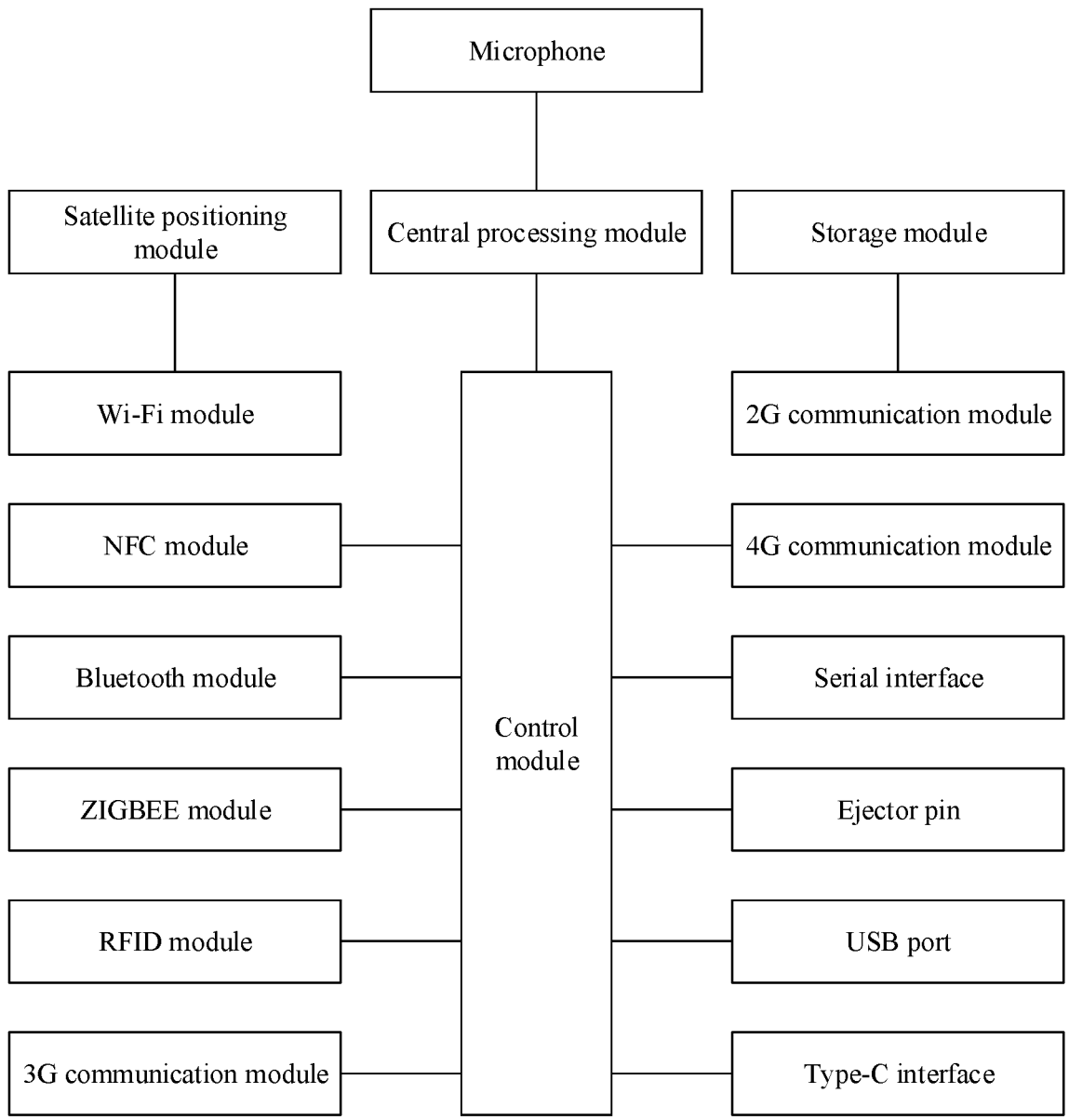
FIG. 1 is a schematic diagram of a structure of a terminal device according to an embodiment of the present embodiment of the invention.

Terminal devices in the current market relate to a plurality of communication protocols, for example, long term evolution (LTE), wideband code division multiple access (WCDMA), global system for mobile communications (GSM), time division-synchronous code division multiple access (TD-SCDMA), wireless local area network (WLAN), Bluetooth, and other protocols. With the addition of next-generation communication protocols such as 5G, a terminal device needs to support a growing quantity of communication protocols. This poses a high challenge to efficiency of testing a communication function of the terminal device under different communication protocols.

In the conventional technology, testing of the communication function of the terminal device includes a sweep-frequency tuning test method and a single-protocol fast Fourier transform test method. In the sweep-frequency tuning test method, the terminal device may change a local oscillator frequency of a down conversion mixer, so that a difference between a frequency of an input signal to be tested and the local oscillator frequency is equal to a required fixed intermediate frequency. Subsequently, a bandpass filter is used to extract the required frequency difference from an intermediate frequency signal, to test and analyze the signal to be tested. In the single-protocol fast Fourier transform test method, a test device digitizes, in time domain, the signal to be tested and then performs fast Fourier transform to obtain a spectrum. Then, a low-pass filter in the test device removes high-frequency components beyond a measurement range from the signal to be tested, and then samples a waveform for analog-to-digital conversion. Subsequently, a microprocessor in the test device receives the sampled waveform and calculates the spectrum of the waveform by using fast Fourier transform. However, the sweep-frequency tuning test method is complex in hardware system, and is applicable only to single-protocol non-real-time measurement, and has a relatively low speed for a large-scale test of a multi-protocol terminal device. The single-protocol fast Fourier transform test method is deeply coupled to characteristics of a front-end radio frequency device. For the large-scale test of the multi-protocol terminal device, each protocol can only be tested serially, and the radio frequency front-end needs to be reconfigured in the process. A test time is multiplied with an increase of a quantity of protocols to be tested. Therefore, the foregoing two existing methods for testing communication protocols have relatively low speeds for testing a multi-protocol terminal device.

To resolve the foregoing problems, the embodiments of this application provide a test method, apparatus, and system, to implement parallel testing of a plurality of communication protocols, and significantly improve efficiency of testing a communication function of a terminal device.

The following first describes an application scenario in the embodiments of this application.

FIG. 1 is a schematic diagram of a structure of a terminal device according to an embodiment of the present embodiment of the invention. Refer to FIG. 1. An existing terminal device usually relates to a plurality of communication protocols, for example, LTE, WCDMA, GSM, TD-SCDMA, WLAN, and Bluetooth. Correspondingly, a plurality of communication modules are disposed in the terminal device and correspond to the foregoing communication protocols. The communication modules may be, for example, a satellite positioning module, a Wi-Fi module, a Bluetooth module, a 2G communication module, a 3G communication module, and a 4G communication module. To ensure that a communication function of each communication module meets a requirement, before the terminal device leaves the factory, a manufacturer needs to test communication functions of all communication modules of the terminal device. The communication test may be performed in an over the air technology (OTA) test environment, or may be performed in a conduction environment.

The following describes a system architecture of a test system provided in an embodiment of this application.

Figure 2:
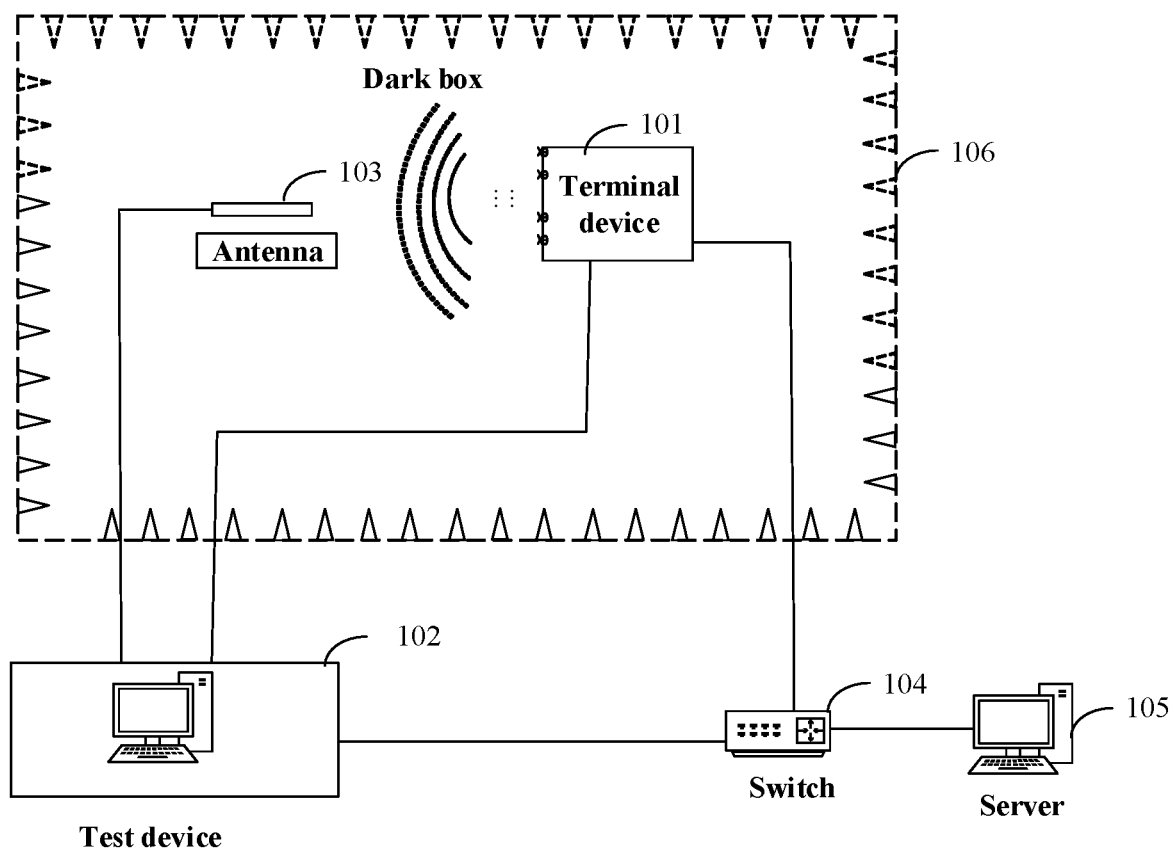
FIG. 2 is a system diagram of an architecture of a test system according to an embodiment of this application.

FIG. 2 is a system diagram of an architecture of test system according to an embodiment of this application. As shown in FIG. 2, the test system includes: a terminal device 101, a test device 102, an antenna 103, a switch 104, a server 105, and a test chamber 106. The test device 102 is separately connected to the antenna 103, the terminal device 101, and the switch 104, and the switch 104 is separately connected to the terminal device 101 and the server 105. The test system in FIG. 2 performs a communication test in an OTA test environment. The terminal device 101 and the antenna 103 are disposed in the test chamber 106. The test device 102 receives, by using the antenna 103, an uplink radio frequency signal sent by the terminal device 101, and sends a downlink radio frequency signal to the terminal device 101, to complete testing of a communication function indicator of the terminal device.

Figure 3:
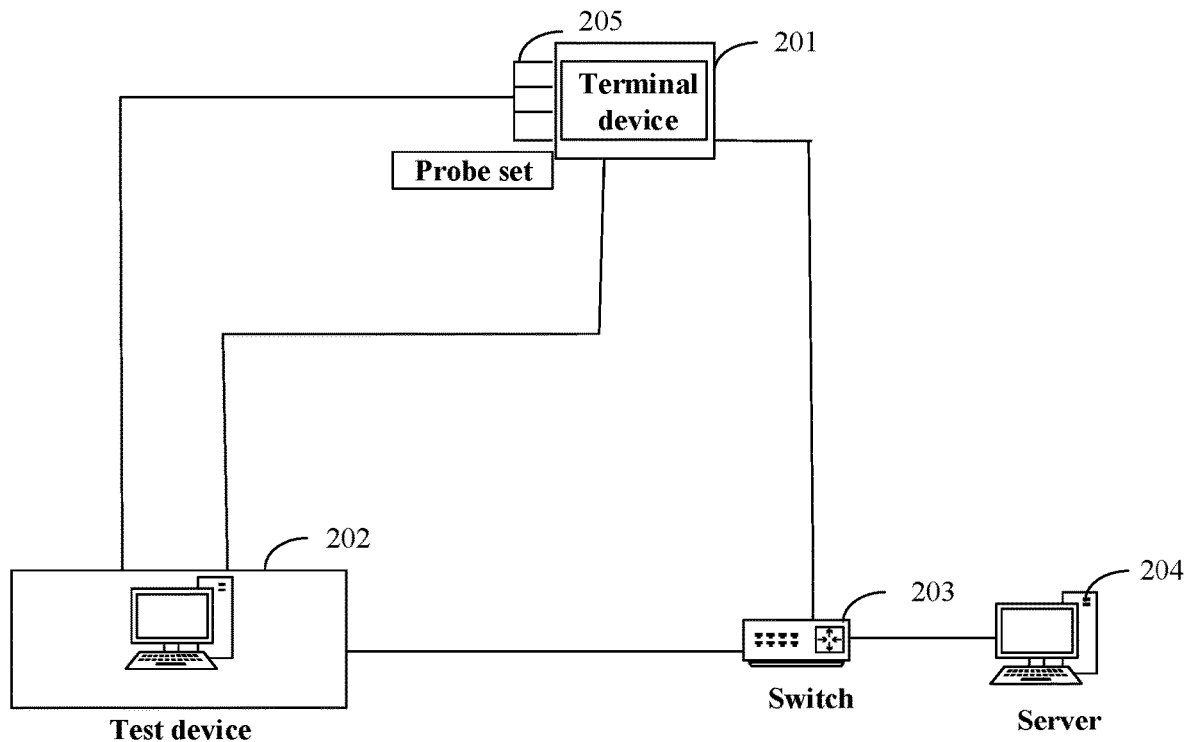
FIG. 3 is a system diagram of an architecture of another test system according to an embodiment of this application.

FIG. 3 is a system diagram of an architecture of another test system according to an embodiment of this application. As shown in FIG. 3, a test system includes: a terminal device 201, a test device 202, a switch 203, a server 204, and a probe set 205. The probe set 205 is disposed on the terminal device, and is connected to the test device 202 The terminal device 201 is further separately directly connected to the test device 202 and the switch 203, and the switch 203 is connected to the server 204. The test system in FIG. 3 performs a communication test in a conduction environment. The test device 102 receives, by using the probe set 205 an uplink radio frequency signal sent by the terminal device 201, and sends a downlink radio frequency signal to the terminal device 201, to complete testing of a communication function indicator of the terminal device.

In FIG. 1 or FIG. 2, the terminal device is also referred to as user equipment, the terminal device may be a wireless terminal, and the wireless terminal may be a device that provides voice and/or other service data connectivity to a user, a handheld device with a wireless connection function, or another processing device connected to a wireless modem. The wireless terminal may communicate with one or more core networks through a radio access network (RAN). The wireless terminal may be a mobile terminal such as a mobile phone (also referred to as a "cellular" phone) and a computer having a mobile terminal. For example, the wireless terminal may be a portable, pocket-sized, handheld, computer built-in, or vehicle-mounted mobile apparatus that exchanges a voice and/or data with the radio access network. For example, it may be a device such as a personal communication service (PCS) phone, a cordless telephone set, a session initiation protocol (SIP) phone, a wireless local loop (WLL) station, or a personal digital assistant (PDA). The wireless terminal may also be referred to as a system, a subscriber unit, a subscriber station, a mobile station, a remote station, a remote terminal, an access terminal, a user terminal, or a user agent. This is not limited herein.

The test device may be a device for testing the communication function of the terminal device, and may be an independent external test device, or may be embedded inside a personal computer in a form of a board card by using a bus. For example, the test device may be a large-bandwidth multi-protocol parallel test device.

The switch is configured to obtain an uplink test result of the terminal device from the test device, or obtain a downlink test result of the terminal device from the terminal device, and send the uplink test result or the downlink test result to the server.

The server is configured to store an uplink test result and/or a downlink test result corresponding to the terminal device.

The test chamber is configured to accommodate some of devices in the test system during the test. For the communication test performed in the OTA test environment in FIG. 2, because a test signal is received and sent by using the antenna, the test signal is interfered by other external signals, and the test chamber needs to isolate the external signals. For the communication test performed in the conduction environment in FIG. 3, because the signal is directly obtained or generated by the probe set, a test signal is not interfered by other external signals, and the test chamber is not required during the test.

Specific embodiments are used below to describe in detail the technical solutions of the embodiments of this application. The following several specific embodiments may be combined with each other, and a same or similar concept or process may not be described repeatedly in some embodiments.

Figure 4:
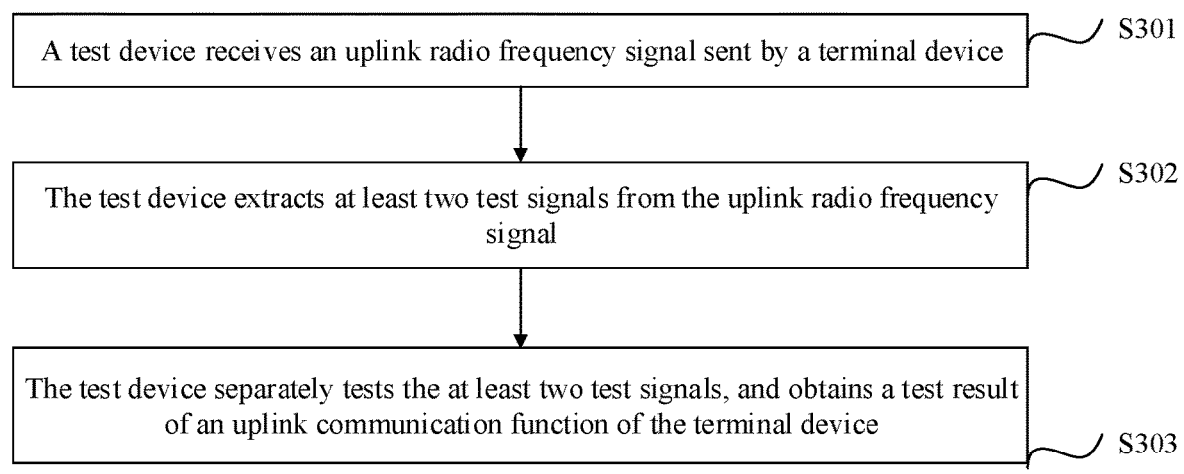
FIG. 4 is a schematic flowchart of a test method according to an embodiment of this application.

FIG. 4 is a schematic flowchart of a test method according to an embodiment of this application. This embodiment relates to a process in which a test device determines an uplink test result of a terminal device based on an uplink radio frequency signal sent by the terminal device. This embodiment is executed by a test device. As shown in FIG. 4, the method includes the following steps.

S301: The test device receives the uplink radio frequency signal sent by the terminal device, where the uplink radio frequency signal is generated by superimposing at least two test signals, and each of the test signals corresponds to one communication protocol and is used to test an uplink communication function of the terminal device corresponding to the communication protocol.

The radio frequency signal is usually an adjusted electric wave that has a particular transmit frequency. In the test method provided in this embodiment of this application, the uplink radio frequency signal may be a radio frequency signal sent by the terminal device to the test device, and correspondingly, a downlink radio frequency signal may be a radio frequency signal sent by the test device to the terminal device. The test device acquires, once in a configured bandwidth, the uplink radio frequency signal sent by the terminal device.

The communication protocol may be a communication protocol corresponding to a communication standard to which the terminal device relates. It should be noted that, there may be one or more communication protocols. A quantity of the communication protocols is not limited in this embodiment of this application, may be determined based on a quantity of communication protocols actually included in the terminal device, or may be determined based on a quantity of communication protocols to be tested.

Table 1 is a classification table of communication protocols. As shown in FIG. 1, the communication protocols may be, for example, long term evolution (LTE), code division multiple access (CDMA), global system for mobile communications (GSM), time division-synchronous code division multiple access (TD-SCDMA), wireless local area network (WLAN), Bluetooth, and other protocols.

TABLE 1

| Category | Protocol |
| --- | --- |
| Basic communication | 5G/mmWave, TDD LTE/FDD LTE, C2k/UMTA/TD-CDMA, GSM/CDMA |
| Positioning | GPS, Beidou, Glonass, Galileo |
| WLAN | 802.11a/b/nac/ad/ax/ay . . . |
| Short range | Bluetooth 3.0/4.0/5.0, NFC, RFID |
| Multimedia | FM, DAB, CMMB, DTMB |
| Future Internet of Things | NB-loT, eMTC, Sigfox, LoRa, RPMA, Zigbee |

It should be noted that, the communication protocols in Table 1 do not limit the communication protocol in this embodiment of this application, and another communication protocol that is not in Table 1 may also be used as the communication protocol in this embodiment of this application.

In this embodiment of this application, the terminal device may include at least two communication protocols, and each communication protocol corresponds to one test signal. When generating the uplink radio frequency signal, the terminal device may superimpose the test signals corresponding to the communication protocols, to further generate the uplink radio frequency signal including a plurality of pieces of test information.

For example, the terminal device may include four communication protocols: the 4G protocol, the 5G protocol, the Wi-Fi protocol, and the bit torrent (BT) protocol, and each protocol corresponds to one test signal. Therefore, the uplink radio frequency signal sent by the terminal device to the test device is generated by superimposing the test signals corresponding to the 4G protocol, the 5G protocol, the Wi-Fi protocol, and the BT protocol.

It should be noted that, in this embodiment of this application, how the test device receives the uplink radio frequency signal sent by the terminal device is not limited. In an optional implementation, for example, in the test system shown in FIG. 2, the test device may receive the uplink radio frequency signal by using the antenna. In another optional implementation, for example, in the test system shown in FIG. 3, the test device may directly obtain the uplink radio frequency signal by using the probe set mounted on the terminal device.

In an optional implementation, before the test device receives the uplink radio frequency signal sent by the terminal device, the terminal device needs to receive an uplink test indication, and generate, based on the uplink test indication, the uplink radio frequency signal through superimposition and send the corresponding uplink radio frequency signal. Generating the uplink radio frequency signal may be specifically as follows: The terminal device generates at least two test signals according to communication protocols, up-converts the at least two test signals to radio frequency frequencies of the communication protocols, performs superimposition to synthesize an in-phase/quadrature signal, and then performs digital-to-analog conversion on the in-phase/quadrature signal to generate the uplink radio frequency signal.

In some embodiments, different test signals respectively occupy different frequency bands in frequency domain, and the test signals that occupy different frequency bands in frequency domain may be superimposed in time domain in the manner of up conversion, to superimpose the at least two test signals into one in-phase/quadrature signal, thereby obtaining the uplink radio frequency signal through digital-to-analog conversion. Up conversion is a manner of modulating a frequency of a test signal. How to modulate the frequency of the test signal is not limited in this embodiment of this application.

S302: The test device extracts the at least two test signals from the uplink radio frequency signal.

In this embodiment of this application, after receiving the uplink radio frequency signal sent by the terminal device, the test device may extract the at least two test signals from the uplink radio frequency signal, to separately test the test signals.

Figure 5:
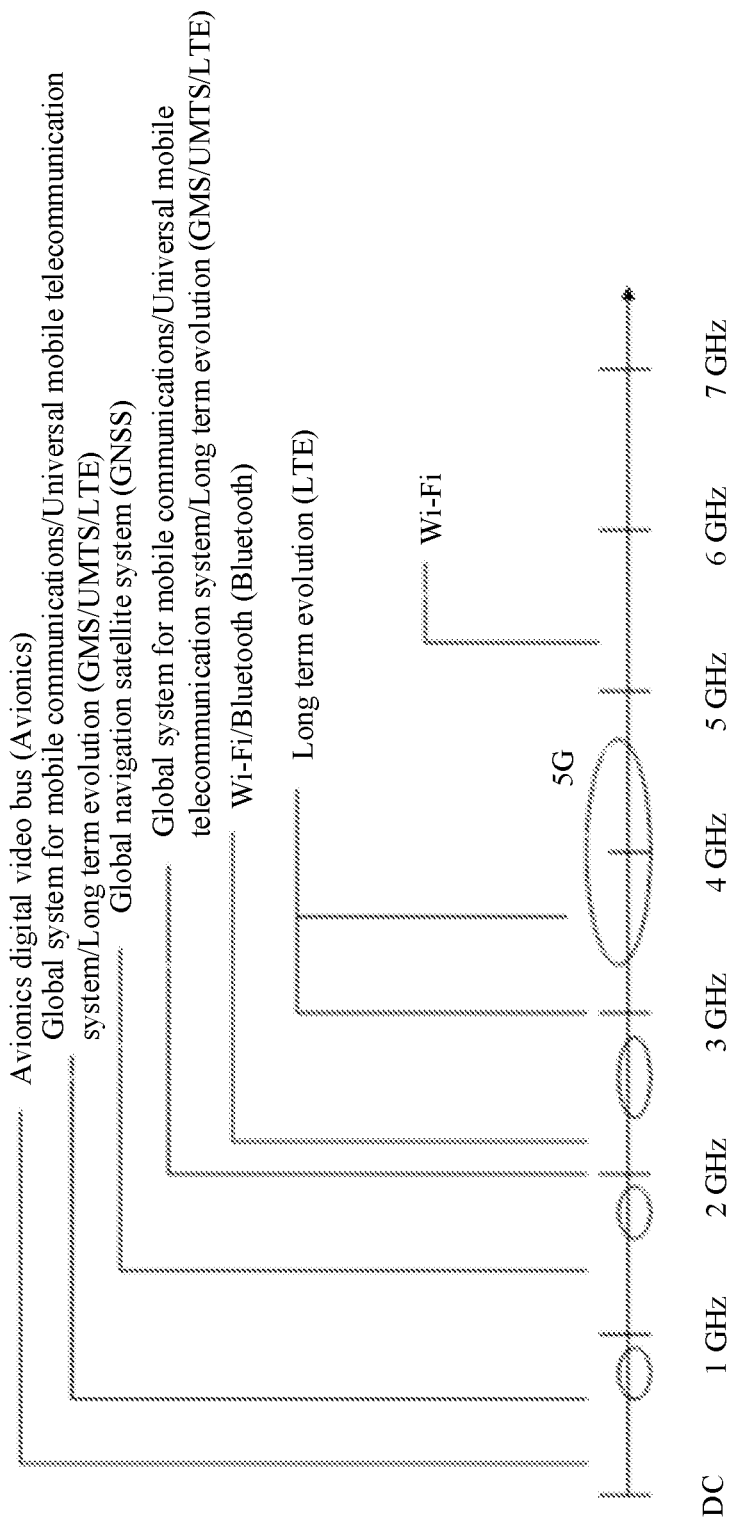
FIG. 5 is a schematic diagram of electromagnetic distribution of test signals of a terminal device according to an embodiment of this application.

FIG. 5 is a schematic diagram of electromagnetic distribution of test signals of a terminal device according to an embodiment of this application. Refer to FIG. 5. Different communication protocols occupy different frequency bands in electromagnetic distribution. When uplink testing is performed, because each test signal corresponds to one communication protocol, the terminal device may generate test signals corresponding to frequency bands occupied by the communication protocols, and generate the uplink radio frequency signal by superimposing the test signals. Because the frequency bands of the test signals corresponding to the communication protocols are different, for the uplink radio frequency signal acquired by the test device in a configured bandwidth, the test signals may be extracted from the uplink radio frequency signal in the frequency bands of the communication protocols, and the test signals are separately tested.

It should be noted that, the test device may extract all the test signals from the uplink radio frequency signal sent by the terminal device, or may extract some of the test signals from the uplink radio frequency signal sent by the terminal device. In this embodiment of this application, a quantity of the test signals extracted by the test device from the uplink radio frequency signal sent by the terminal device is not limited, and may be determined based on actual test content.

For example, the terminal device includes three communication protocols: the communication protocol A, the communication protocol B, and the communication protocol C. The test device pre-receives a test indication, which indicates to test communication functions of the terminal device only for the communication protocol A and the communication protocol B. When uplink testing is performed on the terminal device, after receiving the uplink radio frequency signal sent by the terminal device, the test device may extract only a test signal A corresponding to the communication protocol A and a test signal B corresponding to the communication protocol B from the uplink radio frequency signal, and test the test signal A and the test signal B.

S303: The test device separately tests the at least two test signals, and obtains an uplink test result of the terminal device.

In this embodiment of this application, after extracting the at least two test signals from the uplink radio frequency signal, the test device may separately test the at least two test signals, obtain a test result corresponding to the at least two test signals, and obtain the uplink test result of the terminal device based on the test result corresponding to the at least two test signals.

A type and a quantity of uplink test results are not limited in this embodiment of this application. In an optional implementation, the uplink test result includes at least one of the following: an error vector magnitude (EVM), an adjacent channel power ratio (ACPR), and a power.

How to test information is not limited in this embodiment of this application. In an optional implementation, a corresponding test algorithm may be set based on an actual function test requirement of the terminal device. It should be noted that, there may be one or more test algorithms. This is not limited in this embodiment of this application. A preset test algorithm in the test device may be used to test only a test signal corresponding to a specific communication protocol, or to test all the test signals.

For example, if the uplink radio frequency signal sent by the terminal device is generated by superimposing the test signal A and the test signal B, the test device includes a test algorithm a and a test algorithm b. The test algorithm a may be used to separately test the test signal A and the test signal B, and the test algorithm b may be used to test only the test signal B.

In an optional implementation, the test device separately tests the at least two test signals. A plurality of test sub-results may be obtained based on each test signal. The uplink test result of the terminal device may be determined based on the test sub-results corresponding to the test signals. It should be noted that, in this embodiment of this application, quantities of test sub-results corresponding to different test signals may be the same, or may be different. This is not limited in this embodiment of this application.

For example, if the uplink radio frequency signal sent by the terminal device is generated by superimposing the test signal A, the test signal B, and the test signal C, the test device may test the test signal A, to determine the EVM, the ACPR, and the power corresponding to the test signal A, may test the test signal B, to determine the EVM, the ACPR, and the power corresponding to the test signal B, and may test the test signal C, to determine the EVM and the power corresponding to the test signal C. The uplink test result of the terminal device is determined based on the EVM, the ACPR, and the power corresponding to the test signal A, the EVM, the ACPR, and the power corresponding to the test signal B, and the EVM and the power corresponding to the test signal C.

How to determine the uplink test result of the terminal device based on the test sub-results corresponding to the test signals is not limited in this embodiment of this application. In an optional implementation, if the test sub-results corresponding to any test signal are unqualified, the uplink test result is unqualified. In another optional implementation, if a quantity of unqualified test sub-results corresponding to the test signals exceeds a threshold, the uplink test result is unqualified.

In this embodiment of this application, after extracting the at least two test signals, the test device may distribute the test signals to a corresponding test module, so that the test signals can be tested in parallel. In the conventional technology, protocol compatibility is usually indirectly measured by using an indicator such as outband leakage of a single protocol. In this embodiment of this application, multi-protocol compatibility may be directly assessed by measuring respective indicators under a plurality of protocols in parallel.

In an optional implementation, before the test device separately tests the at least two test signals, the method further includes: The test device preprocesses the at least two test signals, where the preprocessing includes: signal synchronization processing and/or signal balancing processing. The signal synchronization processing is providing same time reference for the signals, to facilitate subsequent processing. Signal balancing is balancing channel characteristics. Characteristics opposite to the channel characteristics are generated by using a balancer on a receiver, and are used to counteract inter-symbol interference caused by time varying multi-path propagation characteristics of the channel.

In this embodiment of this application, the test device receives the uplink radio frequency signal sent by the terminal device, where the uplink radio frequency signal is generated by superimposing the at least two test signals, and each of the test signals corresponds to one communication protocol. After extracting the at least two test signals from the uplink radio frequency signal, the test device separately tests the at least two test signals, and obtains the uplink test result of the terminal device. In this method, when the terminal device includes a plurality of communication protocols, parallel testing of the plurality of communication protocols can be implemented, so that efficiency of testing a communication function of the terminal device is significantly improved.

In this embodiment of this application, the uplink radio frequency signal acquired by the test device in the configured bandwidth is generated by superimposing a plurality of test signals. Therefore, when the test signals are tested, the at least two test signals need to be first extracted from the uplink radio frequency signal, and then the test signals are separately tested. The following describes how the test device extracts the at least two test signals from the uplink radio frequency signal.

Figure 6:
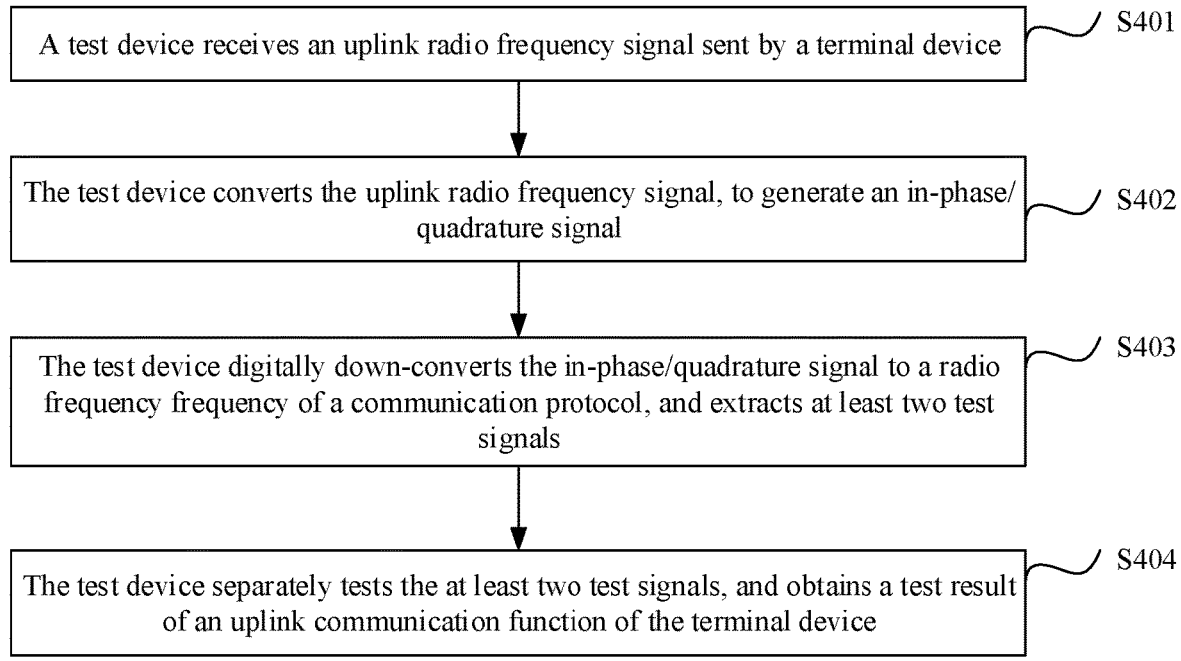
FIG. 6 is a schematic flowchart of another test method according to an embodiment of this application.

FIG. 6 is a schematic flowchart of another test method according to an embodiment of this application. This embodiment is executed by a test device. As shown in FIG. 6, the method includes the following steps.

S401: A test device receives an uplink radio frequency signal sent by a terminal device, where the uplink radio frequency signal is generated by superimposing at least two test signals, and each of the test signals corresponds to one communication protocol.

In this embodiment, a specific implementation process and an implementation principle of step S401 are similar to those of step S301 in Embodiment 1. Details are not described herein again.

S402: The test device converts the uplink radio frequency signal, to generate an in-phase/quadrature signal.

In-phase/quadrature (I/Q) is a manner of indicating a radio frequency signal by using an amplitude and a phase on a polar coordinate. A radio frequency signal in a form of an analog signal may be directly converted into a baseband I/Q signal in a form of a digital signal through in-phase/quadrature processing.

In this step, after receiving the uplink radio frequency signal, the test device may perform in-phase/quadrature processing on the input uplink radio frequency signal, to obtain the generated in-phase/quadrature signal.

In an optional implementation, to convert the uplink radio frequency signal into the in-phase/quadrature signal, analog orthogonal composition may be performed on the uplink radio frequency signal, to generate two local-frequency signals that are orthogonal to each other, as the I/Q signal. In another optional implementation, the uplink radio frequency signal may be directly sampled, to obtain the I/Q signal. In addition, the uplink radio frequency signal may alternatively be converted into the in-phase/quadrature signal by using a filter method, a Hilbert Transform method, or the like. How to convert the uplink radio frequency signal into the in-phase/quadrature signal is not limited in this embodiment of this application.

In this embodiment of this application, before the test device performs analog-to-digital conversion on the uplink radio frequency signal to generate the in-phase/quadrature signal, filtering processing may be further performed on the uplink radio frequency signal. Spurious wave interference in an external environment can be reduced through filtering processing, to improve accuracy of the extracted test signals. A type of the filtering processing is not limited in this embodiment of this application, for example, the filtering processing may be adaptive filtering.

S403: The test device digitally down-converts the in-phase/quadrature signal to a radio frequency of the communication protocol, and extracts the at least two test signals.

Digital down conversion (DDC) may be a technology of down-converting a spectrum of an intermediate frequency digital signal to a baseband signal.

The test device may include a numerically controlled oscillator (NCO), a mixer, and a filter. The digital down conversion may be implemented by the numerically controlled oscillator, the mixer, and the filter. Specifically, the radio frequency signal is an intermediate frequency signal. During the digital down conversion, the intermediate frequency signal may be mixed with a carrier signal generated by the numerically controlled oscillator, and then the baseband signal is obtained by using a low-pass filter, to implement a down conversion function.

In this embodiment of this application, digital down conversion may be separately performed on the in-phase/quadrature signal based on the radio frequency of the communication protocol, to determine test information corresponding to the signal to be tested. The foregoing test signal is a baseband signal.

S404: The test device separately tests the at least two test signals, and obtains an uplink test result of the terminal device.

In this embodiment, a specific implementation process and an implementation principle of step S404 are similar to those of step S301 in Embodiment 1. Details are not described herein again.

Based on the test method provided in this embodiment of this application, the test device performs analog-to-digital conversion on the uplink radio frequency signal, to generate the in-phase/quadrature signal. Subsequently, the test device digitally down-converts the in-phase/quadrature signal to the radio frequency of the communication protocol, and extracts the at least two test signals, to test the at least two test signals. Based on the foregoing method, the test device may extract the at least two test signals, to complete parallel testing of communication functions of the terminal device under different protocols.

In a process of testing the communication function of the terminal device, after uplink testing on the terminal device is completed, a signal receiving function of the terminal device may be further tested. To be specific, downlink testing is performed on the communication function of the terminal device, to ensure that the terminal device not only can normally send signals, but also can normally receive signals by using communication protocols involved. The following describes downlink testing of the communication function of the terminal device according to an embodiment of this application.

Figure 7:
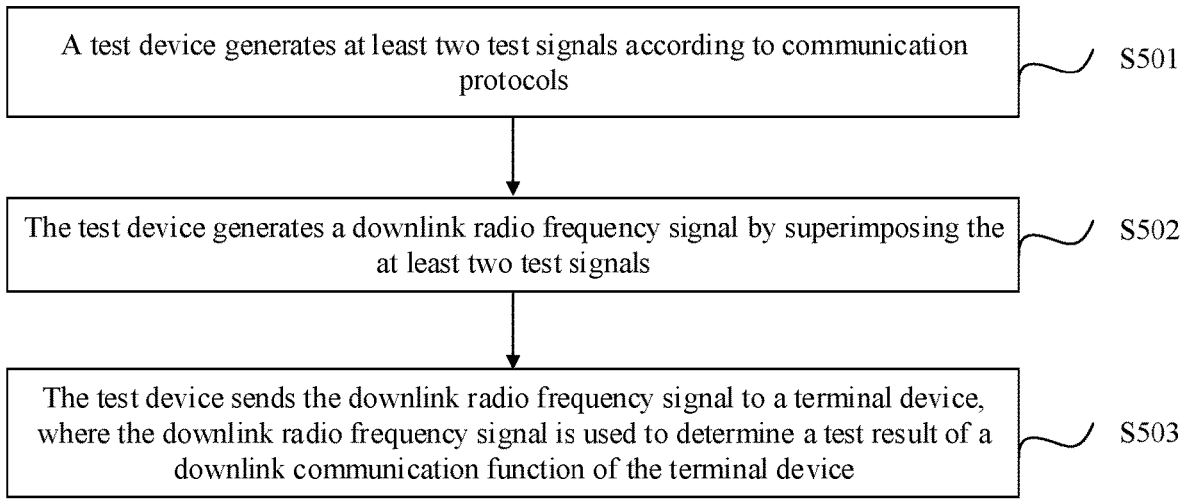
FIG. 7 is a schematic flowchart of still another test method according to an embodiment of this application.

FIG. 7 is a schematic flowchart of still another test method according to an embodiment of this application. This embodiment is executed by a test device. As shown in FIG. 7, the method includes the following steps.

S501: A test device generates at least two test signals according to communication protocols, where each of the test signals corresponds to one communication protocol and is used to test a downlink communication function of the terminal device corresponding to the communication protocol.

The communication protocol may be a communication protocol corresponding to a communication standard to which the terminal device relates. The communication protocols may be, for example, long term evolution (LTE), wideband code division multiple access (WCDMA), global system for mobile communications (GSM), time division-synchronous code division multiple access (TD-SCDMA), wireless local area network (WLAN), Bluetooth, and other protocols.

In this embodiment of this application, the terminal device may include at least two communication protocols, and the test device selects some or all of the at least two communication protocols as the communication protocols based on a received test indication. Subsequently, the test device generates the test signals corresponding to the communication protocols.

For example, the terminal device may include four communication protocols: the 4G protocol, the 5G protocol, the Wi-Fi protocol, and the bit torrent (BT) protocol. After receiving the test indication, the test device needs to test the 4G protocol, the 5G protocol, and the Wi-Fi protocol therein. Therefore, the test device generates a test signal corresponding to the 4G protocol, a test signal corresponding to the 5G protocol, and a test signal corresponding to the Wi-Fi protocol.

S502: The test device generates a downlink radio frequency signal by superimposing the at least two test signals.

In an implementation of this application, after the test device generates the at least two test signals, the at least two test signals may be superimposed to generate the downlink radio frequency signal, so that the terminal device can send the downlink radio frequency signal to the terminal device, and the terminal device performs downlink testing. A downlink test may be a test in which the test device sends a radio frequency signal to the terminal device to test a signal receiving function of the terminal device.

The downlink radio frequency signal may be generated by superimposing the test signals, or may be generated based on some of the test signals. This is not limited in this embodiment of this application. For example, the terminal device may include four communication protocols: the 4G protocol, the 5G protocol, the Wi-Fi protocol, and the bit torrent (BT) protocol. In a downlink test, if only communication functions of the terminal device for the 4G protocol and the 5G protocol are tested, correspondingly, the test device generates the downlink radio frequency signal by superimposing the test signal corresponding to the 4G protocol and the signal corresponding to the 5G protocol.

S503: The test device sends the downlink radio frequency signal to the terminal device, where the downlink radio frequency signal is used to determine a downlink test result of the terminal device.

In this embodiment of this application, after generating the downlink radio frequency signal, the test device may transmit the downlink radio frequency signal to the terminal device, and the terminal device determines the downlink test result of the terminal device based on the downlink radio frequency signal.

In this embodiment of this application, how the test device sends the downlink radio frequency signal is not limited. In an optional implementation, the test device may send the downlink radio frequency signal to the terminal device by using a transmit (Tx) path.

In an optional implementation, the terminal device may extract the at least two test signals from the downlink radio frequency signal, and then separately test the at least two test signals, obtain a test result corresponding to the at least two test signals, and obtain the downlink test result of the terminal device based on the test result corresponding to the at least two test signals.

A type and a quantity of downlink test results are not limited in this embodiment of this application. In an optional implementation, the uplink test result includes at least one of the following: signal sensitivity, blocking, and adjacent channel selectivity.

It should be noted that, in this embodiment of this application, how the terminal device receives the downlink radio frequency signal sent by the test device is not limited. In an optional implementation, for example, in the test system shown in FIG. 2, the terminal device may receive the downlink radio frequency signal by using the antenna. In another optional implementation, for example, in the test system shown in FIG. 3, the terminal device may directly obtain the downlink radio frequency signal by using the probe set mounted on the test device.

In an optional implementation, after the test device sends the downlink radio frequency signal to the terminal device, the terminal device may extract the test signals from the downlink radio frequency signal, and perform parallel testing on the test signals, to determine the downlink test result of the terminal device.

It should be noted that, although a manufacturer performs uplink testing and downlink testing on the terminal device before the terminal device leaves the factory, in the test method provided in this embodiment of this application, only uplink testing may be performed on the communication function of the terminal device, only downlink testing may be performed on the communication function of the terminal device, uplink testing may be first performed on the communication function of the terminal device and then downlink testing is performed, or downlink testing may be performed on the communication function of the terminal device and then uplink testing is performed. This is not limited in this embodiment of this application.

Based on the test method provided in this embodiment of this application, the test device generates the at least two test signals according to the communication protocols, where each test signal corresponds to one communication protocol, and the test device generates the downlink radio frequency signal based on the at least two test signals, and sends the downlink radio frequency signal to the terminal device, where the downlink radio frequency signal is used to determine the downlink test result of the terminal device In this method, when the terminal device includes a plurality of communication protocols, parallel testing of the plurality of communication protocols can be implemented, so that efficiency of testing a communication function of the terminal device is significantly improved.

The following describes how the test device generates the downlink radio frequency signal based on the test signals.

Figure 8:
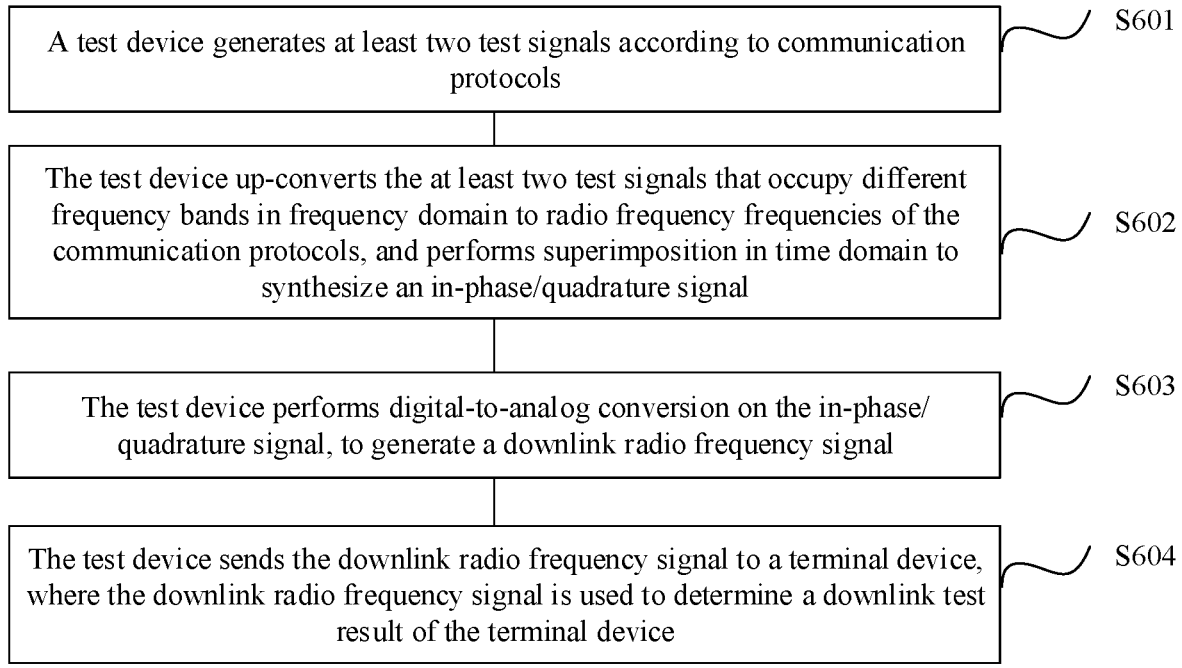
FIG. 8 is a schematic flowchart of yet another test method according to an embodiment of this application.

FIG. 8 is a schematic flowchart of yet another test method according to an embodiment of this application. This embodiment is executed by a test device. As shown in FIG. 8, the method includes the following steps.

S601: A test device generates at least two test signals according to communication protocols, where each of the test signals corresponds to one communication protocol.

In this embodiment, a specific implementation process and an implementation principle of step S601 are similar to those of step S501 in Embodiment 1. Details are not described herein again.

S602: The test device up-converts the at least two test signals that occupy different frequency bands in frequency domain to radio frequency frequencies of the communication protocols, and performs superimposition in time domain to synthesize an in-phase/quadrature signal.

Digital up conversion (digital up converter, DUC) may be a technology of mixing a signal to obtain a signal with a frequency higher than that of the original signal.

In this embodiment of this application, the test signal is a baseband signal. Each test signal may be up-converted into a corresponding intermediate frequency signal by using a radio frequency of a communication protocol corresponding to the test signal. Because different test signals respectively occupy different frequency bands in frequency domain, the test signals that occupy different frequency bands in frequency domain may be superimposed in time domain in the manner of up conversion, to superimpose the at least two test signals into one in-phase/quadrature signal. Up conversion is a manner of modulating a frequency of a test signal. How to modulate the frequency of the test signal is not limited in this embodiment of this application.

In an optional implementation, before the test device up-converts the at least two test signals to the radio frequency frequencies of the communication protocols, and performs superimposition to synthesize the in-phase/quadrature signal, filtering processing may be further performed on the at least two test signals. A type of the filtering processing is not limited in this embodiment of this application, for example, the filtering processing may be adaptive filtering.

S603: The test device performs digital-to-analog conversion on the in-phase/quadrature signal, to generate the downlink radio frequency signal.

In this embodiment of this application, because the foregoing generated I/Q signal is a digital signal, and the radio frequency signal sent by using an antenna is an analog signal, the test device needs to perform digital-to-analog conversion on the I/Q signal, to convert the in-phase/quadrature signal into the downlink radio frequency signal.

How to convert the I/Q signal into the downlink radio frequency signal is not limited in this embodiment of this application. In an optional implementation, this may be implemented by using a digital-to-analog conversion chip.

S604: The test device sends the downlink radio frequency signal to the terminal device, where the downlink radio frequency signal is used to determine a downlink test result of the terminal device.

In this embodiment, a specific implementation process and an implementation principle of step S604 are similar to those of step S503 in Embodiment 1. Details are not described herein again.

Based on the test method provided in this embodiment of this application, the test device up-converts the at least two test signals to the radio frequency of the communication protocol, and performs superimposition to synthesize the in-phase quadrature signal; and performs digital-to-analog conversion on the in-phase quadrature signal, to generate the downlink radio frequency signal. Based on the foregoing method, the downlink radio frequency signal sent by the test device may be enabled to include the at least two test signals, to complete parallel testing of the communication functions of the terminal device under different protocols.

A person of ordinary skill in the art may understand that all or some of the steps of the method embodiments may be implemented by a program instructing related hardware. The program may be stored in a computer-readable storage medium. When the program runs, the steps of the method embodiments are performed. The foregoing storage medium includes various media that can store program code, such as a ROM, a RAM, a magnetic disk, or an optical disc.

Figure 9:
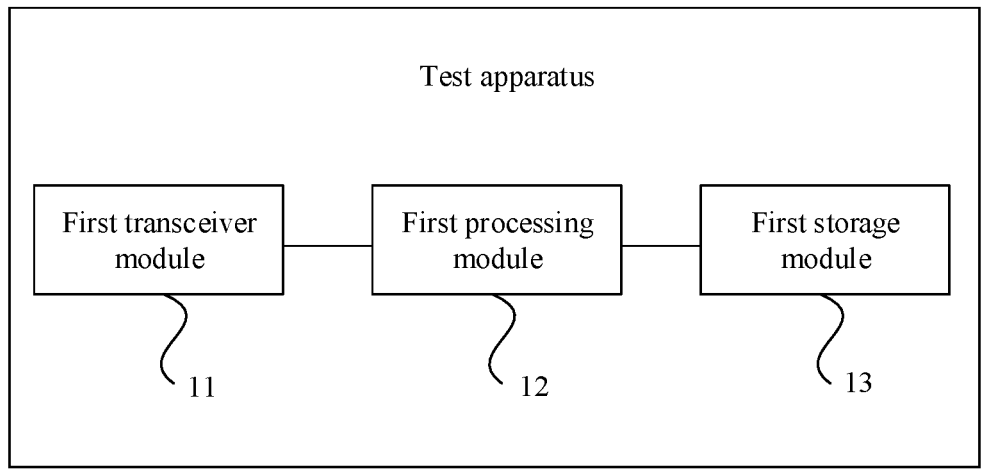
FIG. 9 is a schematic diagram of a structure of a test apparatus according to an embodiment of this application.

FIG. 9 is a schematic diagram of a structure of a test apparatus according to an embodiment of this application. The test apparatus may be configured to perform the method on the test device side in the embodiments shown in FIG. 4 to FIG. 6. As shown in FIG. 9, the test apparatus includes: a first transceiver module 11, a first processing module 12, and a first storage module 13. The first storage module 13 is configured to couple to the first processing module 12, and store program instructions and/or data.

The first transceiver module 11 is configured to receive an uplink radio frequency signal sent by a terminal device, where the uplink radio frequency signal is generated by superimposing at least two test signals, and each of the test signals corresponds to one communication protocol and is used to test an uplink communication function of the terminal device corresponding to the communication protocol.

The first processing module 12 is configured to: extract the at least two test signals from the uplink radio frequency signal; and separately test the at least two test signals, and obtain an uplink test result of the terminal device.

The first processing module 12 may implement a processing function of the first processing module 12 based on a field programmable gate array (FPGA) circuit, a digital signal processing (DSP) circuit, a central processing unit (CPU), and other hardware.

The first storage module 13 may implement a storage function of the first storage module 13 based on a double data rate (DDR) memory, a random access memory (RAM), a flash, and other hardware.

Optionally, the test apparatus may further include a clock module. The clock module may implement timing and management functions of the clock module based on a numerically controlled oscillator (NCO), a voltage-controlled oscillator (VCO), a phase-locked dielectric oscillator (PDRO), and other hardware.

In a possible implementation, the first processing module 12 is specifically configured to: perform analog-to-digital conversion on the uplink radio frequency signal, to generate an in-phase/quadrature signal; and digitally down-convert the in-phase/quadrature signal to a radio frequency of the communication protocol, and extract the at least two test signals.

In a possible implementation, the first processing module 12 is further configured to filter the in-phase/quadrature signal.

In a possible implementation, the first processing module 12 is further configured to preprocess the at least two test signals, where the preprocessing includes: signal synchronization processing and/or signal balancing processing.

In a possible implementation, the uplink test result includes at least one of the following: an error vector magnitude EVM, an adjacent channel power ratio ACPR, and a power.

Figure 10:
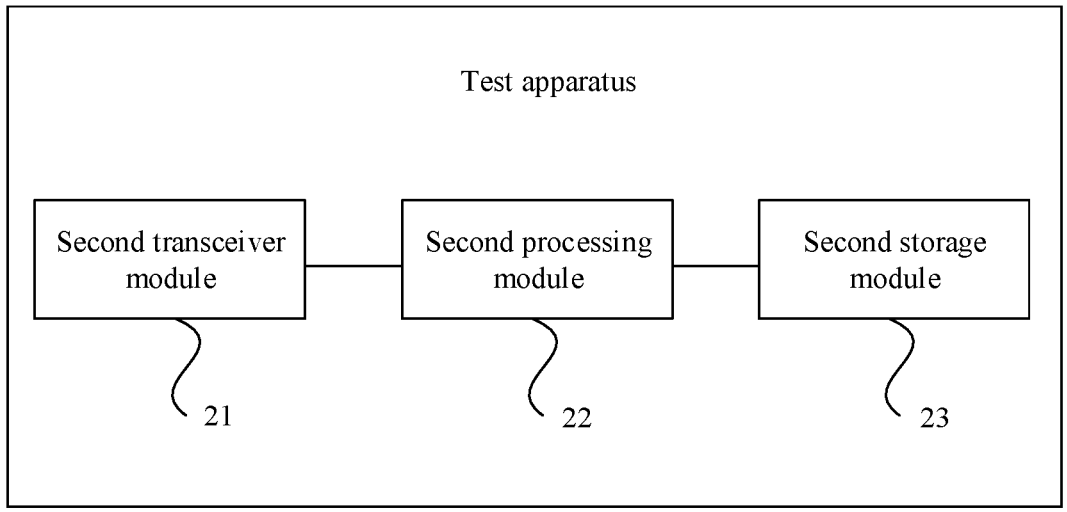
FIG. 10 is a schematic diagram of a structure of another test apparatus according to an embodiment of this application.

FIG. 10 is a schematic diagram of a structure of another test apparatus according to an embodiment of this application. The test apparatus may be configured to perform the method on the terminal device side in the embodiments shown in FIG. 4 to FIG. 6. As shown in FIG. 10, the test apparatus includes: a second transceiver module 21, a second processing module 22, and a second storage module 23. The second storage module 23 is configured to couple to the second processing module 22, and store program instructions and/or data. The second processing module 22 is configured to generate an uplink radio frequency signal.

The second transceiver module 21 is configured to send the uplink radio frequency signal to the test device.

Figure 11:
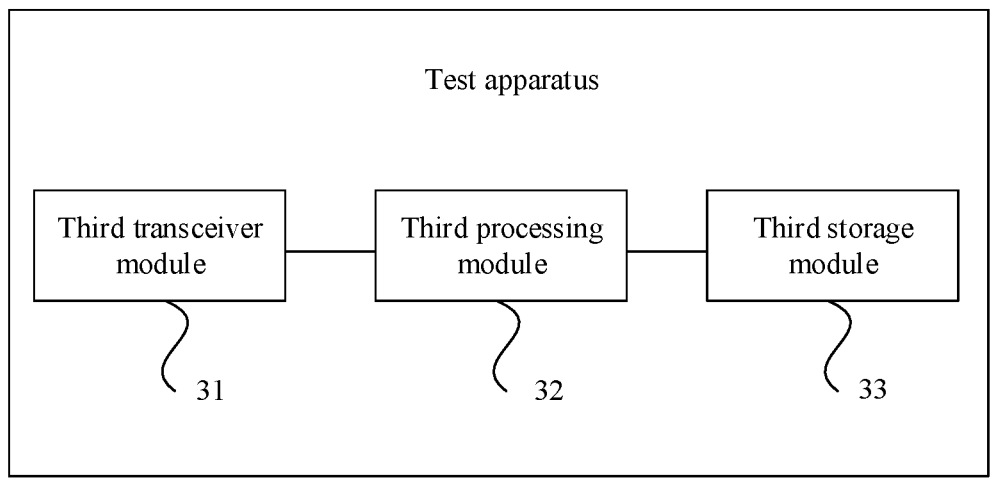
FIG. 11 is a schematic diagram of a structure of still another test apparatus according to an embodiment of this application.

FIG. 11 is a schematic diagram of a structure of still another test apparatus according to an embodiment of this application. The test apparatus may be configured to perform the method on the test device side in the embodiments shown in FIG. 7 and FIG. 8. As shown in FIG. 11, the test apparatus includes: a third transceiver module 31, a third processing module 32, and a third storage module 33. The third storage module 33 is configured to couple to the third processing module 32, and store program instructions and/or data.

The third processing module 32 is configured to: generate at least two test signals according to communication protocols, where each of the test signals corresponds to one of the communication protocols and is used to test a downlink communication function of the terminal device corresponding to the communication protocol; and generate a downlink radio frequency signal by superimposing the at least two test signals.

The third transceiver module 31 is configured to send the downlink radio frequency signal to the terminal device, where the downlink radio frequency signal is used to determine a downlink test result of the terminal device.

The third processing module 32 may implement a processing function of the third processing module 32 based on a field programmable gate array (FPGA) circuit, a digital signal processing (DSP) circuit, a central processing unit (CPU), and other hardware.

The third storage module 33 may implement a storage function of the third storage module 33 based on a double data rate (DDR) memory, a random memory (RAM), a flash, and other hardware.

Optionally, the test apparatus may further include a clock module. The clock module may implement timing and management functions of the clock module based on a numerically controlled oscillator (NCO), a voltage-controlled oscillator (VCO), a phase-locked dielectric oscillator (PDRO), and other hardware.

In a possible implementation, the third processing module 32 is specifically configured to: up-convert the at least two test signals to radio frequency frequencies of the communication protocols, and perform superimposition to synthesize an in-phase/quadrature signal; and perform digital-to-analog conversion on the in-phase/quadrature signal, to generate the downlink radio frequency signal.

In a possible implementation, the third processing module 32 is further configured to filter the at least two test signals.

In a possible implementation, the downlink test result includes at least one of the following: signal sensitivity, blocking, and adjacent channel selectivity.

Figure 12:
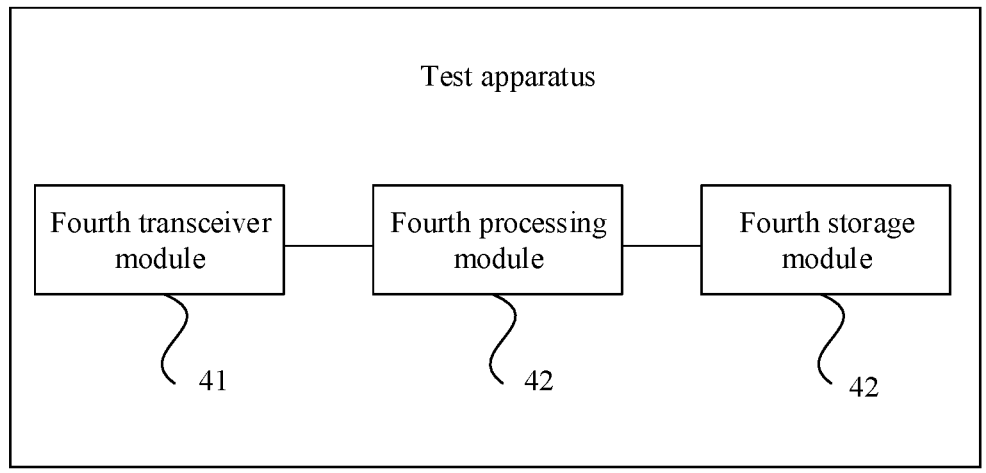
FIG. 12 is a schematic diagram of a structure of yet another test apparatus according to an embodiment of this application.

FIG. 12 is a schematic diagram of a structure of yet another test apparatus according to an embodiment of this application. The test apparatus may be configured to perform the method on the terminal device side in the embodiments shown in FIG. 7 and FIG. 8. As shown in FIG. 12, the test apparatus includes: a fourth transceiver module 41, a fourth processing module 42, and a fourth storage module 43. The fourth storage module 43 is configured to couple to the fourth processing module 42, and store program instructions and/or data.

The fourth transceiver module 41 is configured to receive a downlink radio frequency signal sent by the test apparatus.

The fourth processing module 42 is configured to determine a downlink test result of the terminal device based on the downlink radio frequency signal.

Figure 13:
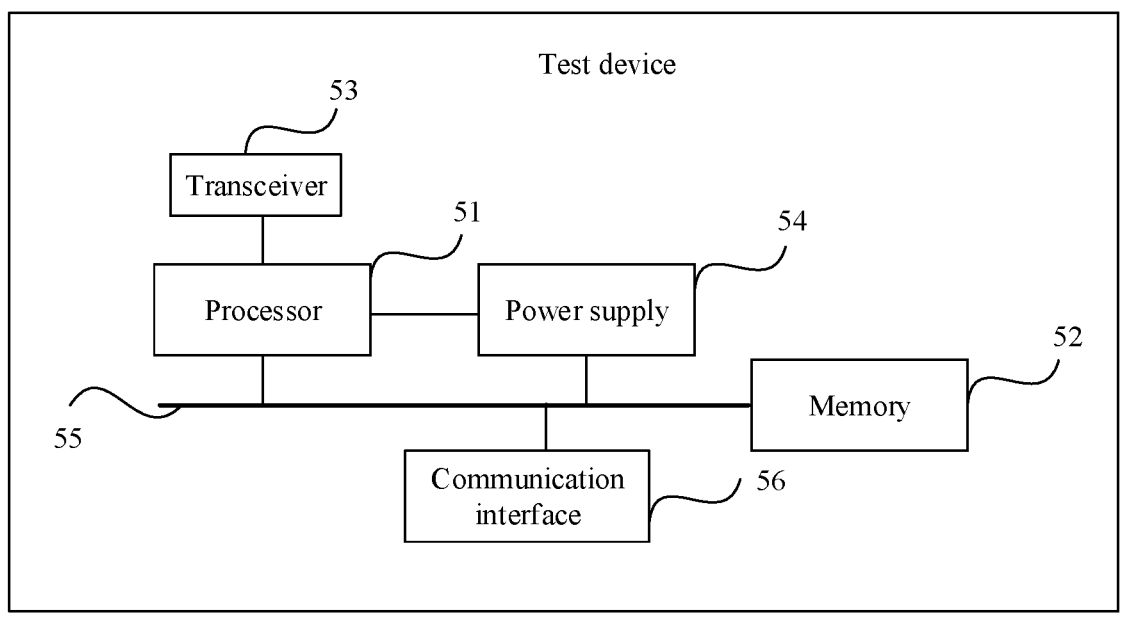
FIG. 13 is a schematic diagram of a structure of a test device according to an embodiment of this application.

FIG. 13 is a schematic diagram of a structure of a test device according to an embodiment of this application. As shown in FIG. 13, the test apparatus may include a processor 51 (for example, a CPU), a memory 52, and a transceiver 53. The transceiver 53 is coupled to the processor 51, and the processor 51 controls a sending and receiving action of the transceiver 53. The memory 52 may include a high-speed random access memory (RAM), and may further include a non-volatile memory (NVM), for example, at least two magnetic disk memories. The memory 52 may store various instructions, to complete various processing functions and implement the steps of the method in this application. In an implementation, the test device in this application may further include: a power supply 54, a communication bus 55, and a communication port 56. The transceiver 53 may be integrated into a transceiver of the test device, or may be an independent transceiver antenna of the test device. The communication bus 55 is configured to implement communication connection between components. The communication port 56 is configured to implement connection and communication between the test device and another peripheral.

In this embodiment of this application, the memory 52 is configured to store computer-executable program code, and the program code includes instructions. When the processor 51 executes the instructions, the instructions enable the processor 51 of the terminal device to perform a processing action of the test device in the foregoing method embodiment, and enables the transceiver 53 to perform a receiving and sending action of the test device in the foregoing method embodiments. Implementation principles and technical effects thereof are similar, and details are not described herein again.

In this embodiment of this application, the test device integrates a conventional cellular instrument, a WLAN instrument, a Bluetooth instrument, and the like together. Compared with the conventional technology, a total size of the instrument is reduced by over 75%.

Figure 14:
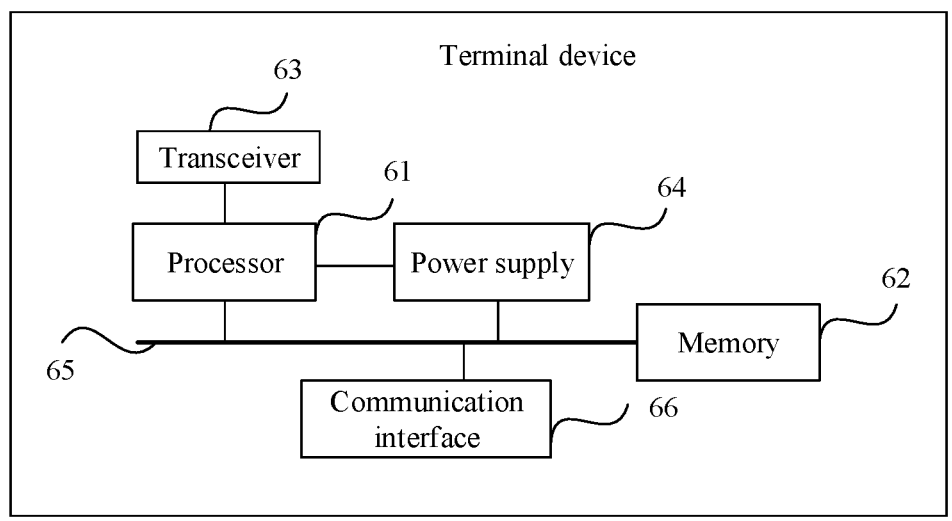
FIG. 14 is a schematic diagram of a structure of a terminal device according to an embodiment of this application.

FIG. 14 is a schematic diagram of a structure of a terminal device according to an embodiment of this application. As shown in FIG. 14, the access network child device may include a processor 61 (for example, a CPU), a memory 62, and a transceiver 63. The transceiver 63 is coupled to the processor 61, and the processor 61 controls a sending and receiving action of the transceiver 63. The memory 62 may include a high-speed random access memory (RAM), and may further include a non-volatile memory (NVM), for example, at least two magnetic disk memories. The memory 62 may store various instructions, to complete various processing functions and implement the steps of the method in this application. In an implementation, the terminal device in this application may further include: a power supply 64, a communication bus 65, and a communication port 66. The transceiver 63 may be integrated into a transceiver of the terminal device, or may be an independent transceiver antenna of the terminal device. The communication bus 65 is configured to implement a communication connection between elements. The communication port 66 is configured to implement connection and communication between the terminal device and another peripheral.

In this embodiment of this application, the memory 62 is configured to store computer-executable program code, and the program code includes instructions. When the processor 61 executes the instructions, the instructions enable the processor 61 of the terminal device to perform a processing action of the terminal device in the foregoing method embodiment, and enable the transceiver 63 to perform sending and receiving actions of the terminal device in the foregoing embodiment. Implementation principles and technical effects thereof are similar to those in the method embodiment. Details are not described herein again.

Figure 15:
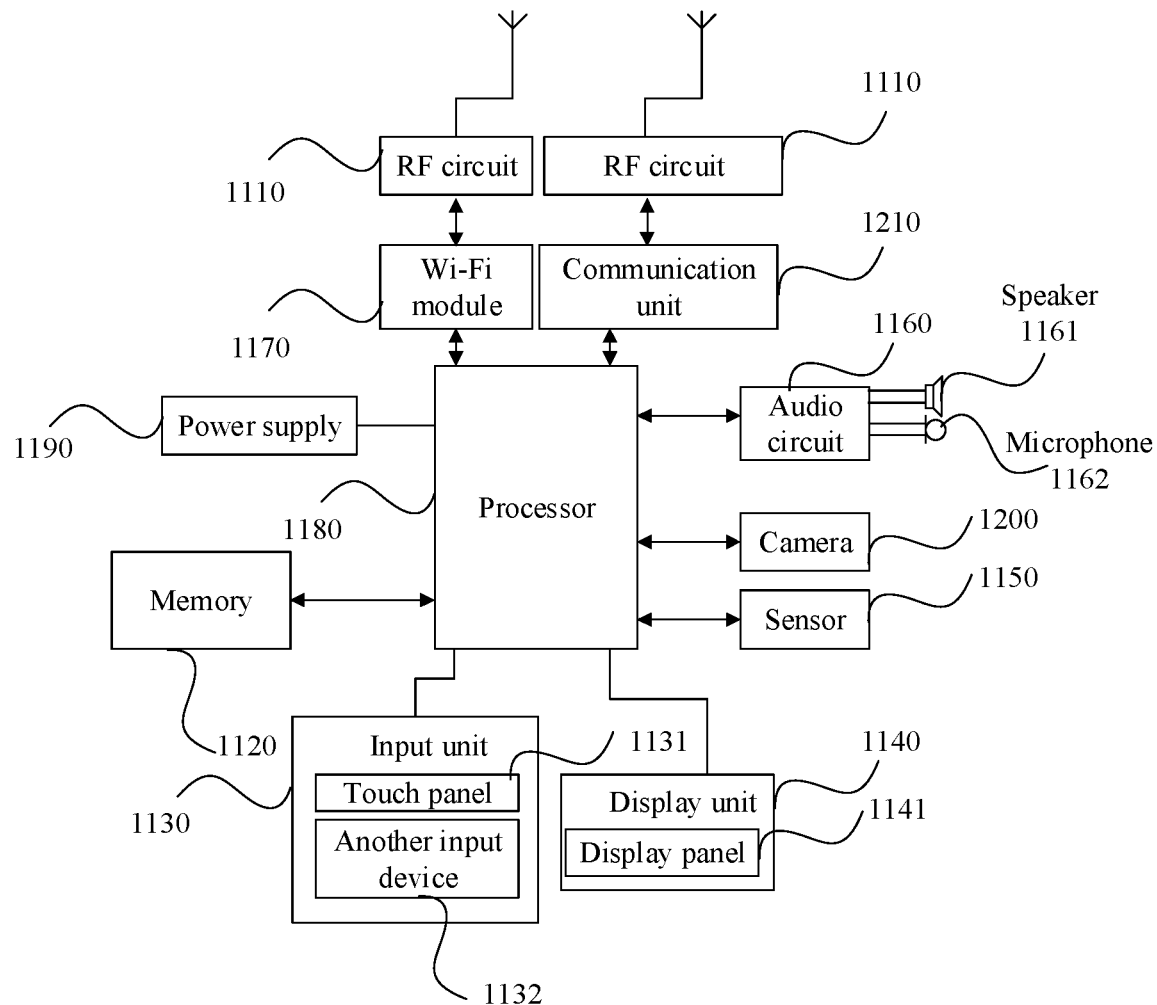
FIG. 15 is a block diagram of a structure of a terminal device that is a mobile phone according to an embodiment of this application.

As described in the foregoing embodiment, the electronic device in this embodiment of this application may be a wireless device such as a mobile phone or a tablet computer. Therefore, that the electronic device is the mobile phone is used as an example. FIG. 15 is a block diagram of a structure of a terminal device that is a mobile phone according to an embodiment of this application. As shown in FIG. 15, the mobile phone may include components such as a radio frequency (RF) circuit 1110, a memory 1120, an input unit 1130, a display unit 1140, a sensor 1150, an audio circuit 1160, a wireless fidelity (Wi-Fi) module 1170, a processor 1180, a power supply 1190, and a communication unit 1210. A person skilled in the art may understand that, the mobile phone structure shown in FIG. 15 does not constitute any limitation on the mobile phone, and may include more or fewer components than those shown in the figure, or some components may be combined, or a different component layout may be used.

Each component of the mobile phone is specifically described below with reference to FIG. 15.

The RF circuit 1110 may be configured to receive and send signals in an information receiving and sending process or a call process. For example, after receiving downlink information from a base station, the RF circuit 1110 sends the downlink information to the processor 1180 for processing; and sends uplink data to the base station. Generally, the RF circuit includes but is not limited to an antenna, at least two amplifiers, a transceiver, a coupler, a low noise amplifier (Low Noise Amplifier, LNA), a duplexer, and the like. In addition, the RF circuit 1110 may further communicate with a network and another device through wireless communication. The wireless communication may use any communication standard or protocol, including but not limited to global system for mobile communications (GSM), a general packet radio service (GPRS), code division multiple access (CDMA), wideband code division multiple access (WCDMA), long term evolution (LTE), an email, a short message service (SMS), and the like.

The memory 1120 may be configured to store a software program and a module. The processor 1180 runs the software program and module stored in the memory 1120, to perform various functional applications and data processing of the mobile phone. The memory 1120 may mainly include a program storage area and a data storage area. The program storage area may store an operating system, an application required by at least two functions (such as a voice playing function and an image playing function), and the like. The data storage area may store data (such as audio data and a phone book) that is created based on use of the mobile phone, and the like. In addition, the memory 1120 may include a high-speed random access memory, and may further include a nonvolatile memory such as at least two magnetic disk storage devices and a flash memory device, or another volatile solid-state storage device.

The input unit 1130 may be configured to: receive input digit or character information, and generate a key signal input related to a user setting and function control of the mobile phone. Specifically, the input unit 1130 may include a touch panel 1131 and another input device 1132. The touch panel 1131, also referred to as a touchscreen, may collect a touch operation (for example, an operation performed by a user on or near the touch panel 1131 by using any suitable object or accessory such as a finger or a stylus) performed by the user on or near the touch panel 1131, and may drive a corresponding connection apparatus based on a preset program. Optionally, the touch panel 1131 may include two parts: a touch detection apparatus and a touch controller. The touch detection apparatus detects a touch direction of the user, detects a signal brought by the touch operation, and transmits the signal to the touch controller. The touch controller receives touch information from the touch detection apparatus, converts the touch information into touch point coordinates, sends the touch point coordinates to the processor 1180, and receives and executes a command sent by the processor 1180. In addition, the touch panel 1131 may be implemented in a plurality of types, such as a resistive type, a capacitive type, an infrared type, and a surface acoustic wave type. The input unit 1130 may further include the another input device 1132 in addition to the touch panel 1131. Specifically, the another input device 1132 may include but is not limited to one or more of a physical keyboard, a function button (such as a volume control button or a power button), a trackball, a mouse, a joystick, and the like.

The display unit 1140 may be configured to display information entered by the user or information provided for the user, and various menus of the mobile phone. The display unit 1140 may include a display panel 1141. Optionally, the display panel 1141 may be configured in a form of a liquid crystal display (LCD), an organic light-emitting diode (OLED), or the like. Further, the touch panel 1131 may cover the display panel 1141. When detecting the touch operation on or near the touch panel 1131, the touch panel 1131 transmits the touch operation to the processor 1180 to determine a type of a touch event, and then the processor 1180 provides a corresponding visual output on the display panel 1141 based on the type of the touch event. In FIG. 10, the touch panel 1131 and the display panel 1141 are used as two independent components to implement input and input functions of the mobile phone. However, in some embodiments, the touch panel 1131 and the display panel 1141 may be integrated to implement the input and output functions of the mobile phone.

The mobile phone may further include at least one sensor 1150, such as an optic sensor, a motion sensor, and another sensor. Specifically, the light sensor may include an ambient light sensor and a proximity sensor. The ambient light sensor may adjust luminance of the display panel 1141 based on brightness of ambient light, and when the mobile phone approaches an ear, the light sensor may turn off the display panel 1141 and/or backlight. As one type of the motion sensor, an accelerometer sensor may detect acceleration values in various directions (usually on three axes). The accelerometer sensor may detect a value and a direction of gravity when the accelerometer sensor is stationary, and may be used to an application for recognizing a mobile phone posture (for example, switching between a landscape screen and a vertical screen, a related game, and magnetometer posture calibration), a function related to vibration recognition (such as a pedometer and a knock), and the like. Other sensors such as a gyroscope, a barometer, a hygrometer, a thermometer, and an infrared sensor may be further configured in the mobile phone. Details are not described herein.

The audio circuit 1160, a speaker 1161, and a microphone 1162 may provide an audio interface between the user and the mobile phone. The audio circuit 1160 may transmit, to the loudspeaker 1161, an electrical signal that is obtained after conversion of received audio data, and the loudspeaker 1161 converts the electrical signal into an acoustic signal and outputs the acoustic signal. In addition, the microphone 1162 converts a collected acoustic signal into an electrical signal, the audio circuit 1160 receives and converts the electrical signal into audio data, and outputs the audio data to the processor 1180 for processing, and then processed audio data is sent to, for example, another mobile phone, by using the RF circuit 1110, or the audio data is output to the memory 1120 for further processing.

Wi-Fi belongs to a short-distance wireless transmission technology. The mobile phone may help, by using the Wi-Fi module 1170, the user receives and sends an email, browse a web page, access streaming media, and the like. The Wi-Fi module 1170 provides wireless broadband internet access for the user. Although the Wi-Fi module 1170 is shown in FIG. 15, it should be understood that the Wi-Fi module 1170 is not a necessary component of the mobile phone, and may be omitted based on a requirement without changing the essence of this embodiment of this application.

The processor 1180 is a control center of the mobile phone, and is connected to various parts of the entire mobile phone by using various interfaces and lines. By running or executing the software program and/or module stored in the memory 1120, and invoking data stored in the memory 1120, the processor 1180 performs various functions of the mobile phone and data processing, to perform overall monitoring on the mobile phone. Optionally, the processor 1180 may include one or more processing units. For example, an application processor and a modem processor may be integrated into the processor 1180, where the application processor mainly processes an operating system, a user interface, an application program, or the like; and the modem processor mainly processes wireless communication. It can be understood that the modem processor may alternatively not be integrated into the processor 1180.

The mobile phone further includes the power supply 1190 (such as a battery) that supplies power to each component. Optionally, the power supply may be logically connected to the processor 1180 by using a power management system, so that functions such as management of charging, discharging, and power consumption are implemented by using the power management system.

The mobile phone may further include a camera 1200. The camera may be a front-facing camera or a rear-facing camera. Although not shown, the mobile phone may further include a Bluetooth module, a GPS module, and the like. Details are not described herein.

In this embodiment of this application, the processor 1180 included in the mobile phone may be configured to execute the foregoing test method embodiments. Implementation principles and technical effects thereof are similar to those of the foregoing method embodiments, and details are not described herein again.

An embodiment of this application further provides a chip, including a processor and an interface. The interface is configured to input/output data or instructions processed by the processor. The processor is configured to perform the methods provided in the foregoing method embodiments. The chip may be applied to a server or may be applied to a first electronic device.

An embodiment of this application further provides a program. The program is configured to perform the methods provided in the foregoing method embodiments when executed by a processor.

An embodiment of this application further provides a program product, for example, a computer-readable storage medium. The program product stores instructions. When run on a computer, the program product enables the computer to perform the methods provided in the foregoing method embodiments.

All or some of the foregoing embodiments may be implemented by using software, hardware, firmware, or any combination thereof. When the software is used to implement the embodiments, all or some of the embodiments may be implemented in a form of a computer program product. The computer program product includes one or more computer instructions. When the computer program instructions are loaded and executed on a computer, all or some of the procedures or functions according to the embodiments of the present embodiment of the invention are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

What is claimed is:

1. A test method, comprising:
   receiving, by a test device, a test indication, wherein the test indication indicates at least two communication protocols to be superimposed into an uplink radio frequency signal, each of the at least two communication protocols corresponding to a different respective test signal of at least two test signals, and each of the at least two test signals corresponds to a different communication protocol;
   after receiving the test indication indicating the at least two communication protocols to be superimposed into an uplink radio frequency signal, receiving, by the test device, the uplink radio frequency signal sent by a terminal device, wherein the uplink radio frequency signal is generated by superimposing the at least two test signals, and wherein each of the at least two test signals is used to test an uplink communication function of the terminal device corresponding to the respective communication protocol, and wherein the different communication protocols correspond to different radio access technologies;
   extracting, by the test device, the at least two test signals from the uplink radio frequency signal based on the test indication;
   separately testing, by the test device, the at least two test signals; and
   obtaining, by the test device, an uplink test result of the uplink communication function of the terminal device.

2. The test method according to claim 1, wherein the extracting, by the test device, the at least two test signals from the uplink radio frequency signal comprises:
   performing, by the test device, analog-to-digital conversion on the uplink radio frequency signal to generate an in-phase/quadrature signal;
   digitally down-converting, by the test device, the in-phase/quadrature signal to a radio frequency of the communication protocol; and
   extracting, by the test device, the at least two test signals.

3. The test method according to claim 2, wherein before the digitally down-converting, by the test device, the in-phase/quadrature signal to a radio frequency of the communication protocol, the test method further comprises:
   filtering, by the test device, the in-phase/quadrature signal.

4. The test method according to claim 1, wherein before the separately testing, by the test device, the at least two test signals, the test method further comprises:
   preprocessing, by the test device, the at least two test signals, wherein the preprocessing comprises at least one of signal synchronization processing or signal balancing processing.

5. The test method according to claim 1, wherein the uplink test result comprises at least one of the following: an error vector magnitude (EVM), an adjacent channel power ratio (ACPR), or a power.

6. A test method, comprising:
   receiving, by a test device, a test indication, wherein the test indication indicates at least two communication protocols to be superimposed into an uplink radio frequency signal, each of the at least two communication protocols corresponding to a different respective test signal of at least two test signals, and each of the at least two test signals corresponds to a different communication protocol;
   based on the test indication, generating, by the test device, the at least two test signals, wherein each of the at least two test signals corresponds to a different one of the communication protocols and is used to test a downlink communication function of a terminal device corresponding to the respective communication protocol, and wherein the different communication protocols correspond to different radio access technologies;
   generating, by the test device, a downlink radio frequency signal by superimposing the at least two test signals; and
   sending, by the test device, the downlink radio frequency signal to the terminal device, wherein the downlink radio frequency signal is used to determine a downlink test result of the terminal device.

7. The test method according to claim 6, wherein the generating, by the test device, a downlink radio frequency signal by superimposing the at least two test signals comprises:
   up-converting, by the test device, the at least two test signals that occupy different frequency bands in frequency domain to radio frequency frequencies of the communication protocols;
   performing, by the test device, superimposition in time domain to synthesize an in-phase/quadrature signal; and
   performing, by the test device, digital-to-analog conversion on the in-phase/quadrature signal to generate the downlink radio frequency signal.

8. The test method according to claim 7, wherein before the up-converting, by the test device, the at least two test signals to radio frequency frequencies of the communication protocols, the test method further comprises:
   filtering, by the test device, the at least two test signals.

9. The test method according to claim 6, wherein the downlink test result comprises at least one of the following: signal sensitivity, blocking, or adjacent channel selectivity.

10. A test apparatus, comprising:
    at least one processor; and
    one or more memories coupled to the at least one processor and storing program instructions for execution by the at least one processor to:
      receive a test indication, wherein the test indication indicates at least two communication protocols to be superimposed into an uplink radio frequency signal, each of the at least two communication protocols corresponding to a different respective test signal of at least two test signals, and each of the at least two test signals corresponds to a different communication protocol;
      after receiving the test indication indicating the at least two communication protocols to be superimposed into an uplink radio frequency signal, receive an uplink radio frequency signal sent by a terminal device, wherein the uplink radio frequency signal is generated by superimposing the at least two test signals, and wherein each of the at least two test signals is used to test an uplink communication function of the terminal device corresponding to the respective communication protocol, and wherein the different communication protocols correspond to different radio access technologies;

extract the at least two test signals from the uplink radio frequency signal based on the test indication;

separately test the at least two test signals; and obtain an uplink test result of the terminal device.

11. The test apparatus according to claim 10, wherein the one or more memories store the program instructions for execution by the at least one processor to:

perform analog-to-digital conversion on the uplink radio frequency signal to generate an in-phase/quadrature signal;

digitally down-convert the in-phase/quadrature signal to a radio frequency of the communication protocol; and extract the at least two test signals.

12. The test apparatus according to claim 11, wherein the one or more memories store the program instructions for execution by the at least one processor to filter the in-phase/quadrature signal.

13. The test apparatus according to claim 10, wherein the one or more memories store the program instructions for execution by the at least one processor to preprocess the at least two test signals, wherein the preprocessing comprises at least one of signal synchronization processing or signal balancing processing.

14. The test apparatus according to claim 10, wherein the uplink test result comprises at least one of the following: an error vector magnitude (EVM), an adjacent channel power ratio (ACPR), or a power.

\* \* \* \* \*